(12) United States Patent
Zhao et al.

(10) Patent No.: US 9,933,641 B2
(45) Date of Patent: Apr. 3, 2018

(54) CONNECTOR DISENGAGEMENT APPARATUS AND INSPECTION SYSTEM FOR LIQUID CRYSTAL DISPLAY MODULE

(71) Applicants: BOE Technology Group Co., Ltd., Beijing (CN); BOE (Hebei) Mobile Display Technology Co., Ltd., Hebei (CN)

(72) Inventors: Lei Zhao, Beijing (CN); Tao Wang, Beijing (CN); Moyu Zhu, Beijing (CN)

(73) Assignees: BOE TECHNOLOGY GROUP CO., LTD., Beijing (CN); BOE (HEBEI) MOBILE DISPLAY TECHNOLOGY CO., LTD., Hebei (CN)

( * ) Notice: Subject to any disclaimer, the term of this patent is extended or adjusted under 35 U.S.C. 154(b) by 771 days.

(21) Appl. No.: 14/497,861

(22) Filed: Sep. 26, 2014

(65) Prior Publication Data
US 2015/0323592 A1 Nov. 12, 2015

(30) Foreign Application Priority Data
May 9, 2014 (CN) .......................... 2014 1 0196836

(51) Int. Cl.
*G02F 1/13* (2006.01)
*G01R 31/28* (2006.01)
*H01R 13/635* (2006.01)

(52) U.S. Cl.
CPC ....... *G02F 1/1309* (2013.01); *G01R 31/2889* (2013.01); *H01R 13/635* (2013.01)

(58) Field of Classification Search
CPC ... H01R 13/635; G02F 1/1309; G02F 1/1303; G01R 31/2889; G01R 27/02

USPC ...... 324/756.01–758.01, 500, 538, 324/762.01–762.05, 724, 754.1–754.14, 324/755.05–755.07
See application file for complete search history.

(56) References Cited

FOREIGN PATENT DOCUMENTS

CN 101453077 A * 11/2007
CN 101409413 A 4/2009
(Continued)

OTHER PUBLICATIONS

First Office Action, including Search Report, for Chinese Patent Application No. 201410196836.3, dated Jan. 28, 2016, 8 pages.

*Primary Examiner* — Melissa Koval
*Assistant Examiner* — Trung Nguyen
(74) *Attorney, Agent, or Firm* — Westman, Champlin & Keohler, P.A.

(57) ABSTRACT

The present disclosure provides a connector disengagement apparatus and an inspection system for a liquid crystal display module. The connector disengagement apparatus comprises a first member, a second member, a third member, a rotation axle and a stiffener carrying a part of a connector, one end of the first member being connected to one end of the second member, the other end of the first member being arranged towards the stiffener, the other end of the second member being connected to the third member, wherein the second member is rotatable about the rotation axle. The connector disengagement apparatus acts on the stiffener in a down-to-up direction to lift the stiffener to interrupt efficiently the connection of the connector. In the disengagement process, the pins of the connector will not be damaged as the force of the disengagement apparatus is not directly applied onto the connector.

20 Claims, 4 Drawing Sheets

(56) References Cited

FOREIGN PATENT DOCUMENTS

CN       101453077 A    6/2009
JP       2004-258131 A    9/2004

\* cited by examiner

CONNECTOR DISENGAGEMENT APPARATUS AND INSPECTION SYSTEM FOR LIQUID CRYSTAL DISPLAY MODULE

CROSS-REFERENCE TO RELATED APPLICATION

This application claims the benefit of Chinese Patent Application No. 201410196836.3 filed on May 9, 2014 in the State Intellectual Property Office of China, the whole disclosure of which is incorporated herein by reference.

BACKGROUND OF THE INVENTION

Field of the Invention

The present disclosure relates to a connector disengagement apparatus and an inspection system for a liquid crystal display module.

Description of the Related Art

At present, in the technical field of display, a jig for inspection of lighting a liquid crystal display module is needed during manufacturing liquid crystal productions. In the inspection process, it is needed to connect a connector part of FPC (Flexible Printed Circuit) with a connector part of PCB (Printed Circuit Board) clamp, for example, to join a male plug of the connector part of FPC with a female plug of the connector part of PCB clamp together. After the inspection is completed, the male plug of the connector part of FPC should be disconnected from the female plug of the connector part of PCB clamp.

Conventionally, the disconnection of the connector part of FPC from the connector part of PCB clamp is typically achieved by manually disengaging them from each other or by disengaging them from each other from one side of the connector, for example, by mounting an elastic flake to the top of the female plug of the connector part of the PCB clamp and lifting off the male plug of the FPC connector part by means of an elastic force of the elastic flake. All of these disengaging operations or disconnections are achieved by applying a force directly onto the body of the connector.

SUMMARY OF THE INVENTION

An embodiment of the present invention provides a connector disengagement apparatus, which may interrupt the connection between the connectors efficiently without interfering with the connection and breaking down pins, and an inspection system for a liquid crystal display module.

In view of the above problems in the prior, an embodiment of the present invention provides a connector disengagement apparatus comprising a first member, a second member, a third member, a rotation axle and a stiffener carrying a part of a connector, one end of the first member being connected to one end of the second member, the other end of the first member being arranged towards the stiffener, the other end of the second member being connected to the third member, wherein the second member is rotatable about the rotation axle.

An embodiment of the present invention also provides an inspection system for a liquid crystal display module, comprising:

a connector disengagement apparatus comprising a first member, a second member, a third member, a rotation axle and a stiffener carrying a part of a connector, one end of the first member being connected to one end of the second member, the other end of the first member being arranged towards the stiffener, the other end of the second member being connected to the third member, wherein the second member is rotatable about the rotation axle; and a jig comprising the connector, a side wall and an upper cover connected vertically to the side wall, the connector comprising a female plug and a male plug, wherein one of the female plug and the male plug is connected with a printed circuit board, the other is connected to the liquid crystal display module to be inspected, the stiffener of the connector disengagement apparatus being connected securely to one of the female plug and the male plug, the upper cover being provided with a clamp for clamping the printed circuit board thereon.

BRIEF DESCRIPTION OF THE DRAWINGS

The above and other features of the present invention will become more apparent by describing in detail exemplary embodiments thereof with reference to the accompanying drawings. Throughout specification and drawings, same numerals represent same or similar members.

REFERENCE NUMERICAL

Figure 1:
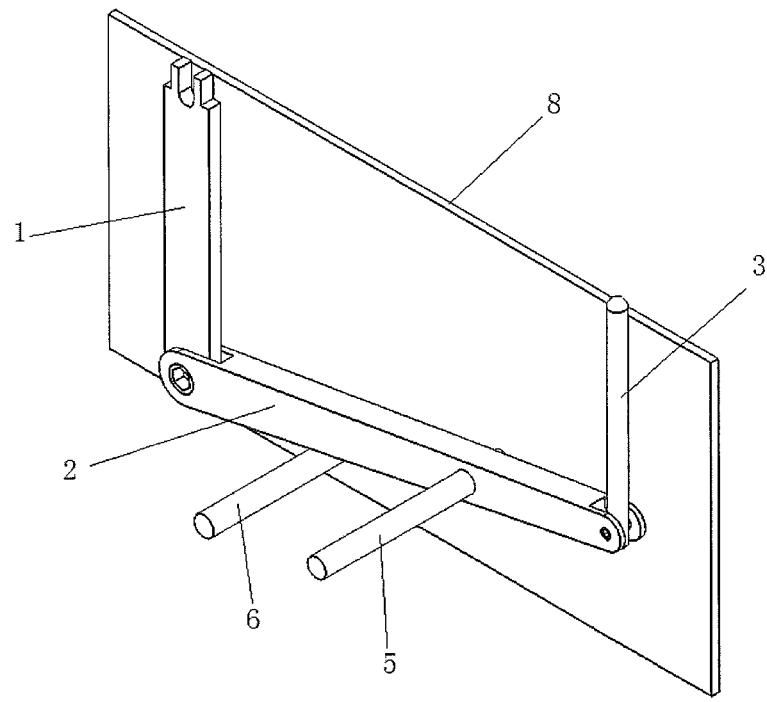
FIG. 1 is a schematic view showing a structure of a connector disengagement apparatus according to an embodiment of the present invention.

1—first member; 2—second member; 3—third member; 4—stiffener; 5—rotation axle; 6—stopper; 7—upper cover; 8—side wall; 9—liquid crystal display module; 10—clamp plate; 11—top face; 12—stop face; 18—male plug; 19—female plug; 2—first terminal; 22—second terminal; 23—axle hole; 31—pressing portion; 211—first circular hole; 221—second circular hole.

DETAILED DESCRIPTION OF PREFERRED EMBODIMENTS OF THE INVENTION

The embodiments of the present invention will be further explained below with reference to the figures and examples. The following embodiments are only explained by way of examples, instead of being intended to limit the scope of the present invention.

In accordance with a general invention concept of the present disclosure, a connector disengagement apparatus is provided, comprising a first member, a second member, a third member, a rotation axle and a stiffener carrying a part of the connector, one end of the first member being connected to one end of the second member, the other end of the first member being arranged towards the stiffener, the other end of the second member being connected to the third member, wherein the second member is rotatable about the rotation axle.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In the embodiments of the present invention, unless otherwise stated, the term of "several" means "two or more"; the terms of "upper", "lower", "left", "right", "inner", "outer", "front end", "back end", "head", "tail" and the like represent orientation or position relationship shown in figures. These terms are intended for convenience of description instead of presenting or inspiring the specified device or element must have a specified orientation or be constructed and operated in specified orientation, and thus they are not intended to limit the present invention. In addition, the terms of "first", "second", "third" and the like are stated for convenience in description, instead of presenting or inspiring relative importance.

In the embodiments of the present invention, it should be noted that, unless specified or defined explicitly otherwise, the term of "connection" should be explained broadly, for example, it may indicate a fixed connection, or may indicate a dismountable connection, or an integral connection; it may also indicate a mechanical connection, or an electrical connection; it may else indicate a direct connection or a connection via an intermediate medium. The skilled person in the art would appreciate the specific signification thereof in the present invention in practice.

As illustrated in FIGS. 1, 5-7, a connector disengagement apparatus according to an embodiment comprises a first member 1, a second member 2, a third member 3, a stiffener 4 and a rotation axle 5. The stiffener 4 is configured to carry a part of the connector. One end of the first member 1 is connected to one end of the second member 2. The other end of the first member 1 is arranged towards the stiffener 4 for pushing and lifting an edge of the stiffener 4. The other end of the second member 2 is connected to the third member 3. The second member 2 may be rotated about the rotation axle 5 by pressing the third member 3 down. On basis of lever principle, the rotation axle 5 functions as a fulcrum and the second member 2 drives the first member 1 to move upwardly and lift the edge of the stiffener 4 so as to interrupt the connection of the connector efficiently, for example, the connection between the connector part of the FPC and the connector part of the PCB clamp. As an example, the stiffener 4 may enhance the rigidity of the FPC, for example may be used as the stiffener 4 of the FPC. In an example, the stiffener 4 may be a flat plate with rigidity greater than that of the FPC. In the whole process of disengagement, the stiffener 4 is subject to the even force. The first member 1 acts on the stiffener 4 instead of the connector directly, thus it will not damage the pins of the connector.

As an example, the rotation axle 5 may be arranged to pass through the second member 2.

As an example, for its automatic restoration, the connector disengagement apparatus may use a principle of unequal torque lever to achieve its automatic restoration.

In an example, with respect to the rotation axle 5, the weight sum of the part of the second member 2 at the side thereof connected to the first member 1 and the first member 1 is greater than that of the part of the second member 2 at the side connected to the third member 3 and the third member 3, i.e., with reference to FIG. 1, the sum of the weights of the part of the second member 2 on the left side of the rotation axle 5 and the first member 1 is greater than that of the part of the second member 2 at the right side of the rotation axle 5 and the third member 3. Due to gravity effects, the second member 2 is inclined to the left.

As illustrated in FIG. 1, in order to make the disengagement apparatus to be in a naturally balanced state to prevent excessive inclination of the second member 2, in an example, a stopper 6 may be provided, which may be located below the second member 2 at the side thereof connected to the first member 1 (with respect to the rotation axle 5) and may be configured to limit the rotation of the second member 2. The stopper 6 functions to keep the whole system to balance in a natural state. In the balanced state, the connector is in the connection state, for example, the connector part of FPC and the connector part of the PCB clamp are connected to each other, i.e., the male plug 18 and the female plug 19 are connected to each other and the first member 1 and the stiffener 4 are separated from each other.

Figure 2:
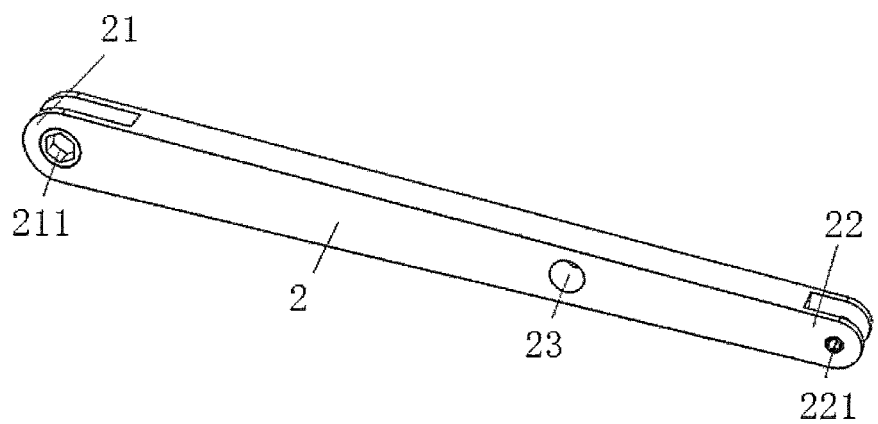
FIG. 2 is a schematic view showing a structure of a second member of the connector disengagement apparatus according to an embodiment of the present invention.

In an example, as illustrated in FIG. 2, the second member 2 is provided with a first terminal 21 hinged to an end of the first member 1 and a second terminal 22 hinged to an end of the third member 3 on both ends thereof. An axle hole 23 through which the rotation axle 5 passes is arranged between the first terminal 21 and the second terminal 22 on the second member 2.

In an example, each of the first terminal 21 and the second terminal 22 has a semicircular shape. The first terminal 21 has a radius 1.5-2.5 times greater than that of the second terminal 22, for example, the radius of the first terminal 21 is 1.5 times of the radius of the second terminal 22.

Further, in an example, the first terminal 21 is provided with a first circular hole 211 at its circular center, the first circular hole 211 being pivotally connected by a pin to a circular hole of the first member 1 to allow the rotation between the first member 1 and the first terminal 21. The second terminal 22 is provided with a second circular hole 221 at its circular center, the second circular hole 221 being pivotally connected by a pin to a circular hole of the third member 3 to allow the rotation between the third member 3 and the second terminal 22. As an example, the center distance between the first circular hole 211 and the axle hole 23 is 2-4 times greater than that between the second circular hole 221 and the axle hole 23. For example, the center distance between the first circular hole 211 and the axle hole 23 is 2 times of that between the second circular hole 221 and the axle hole 23.

Figure 3:
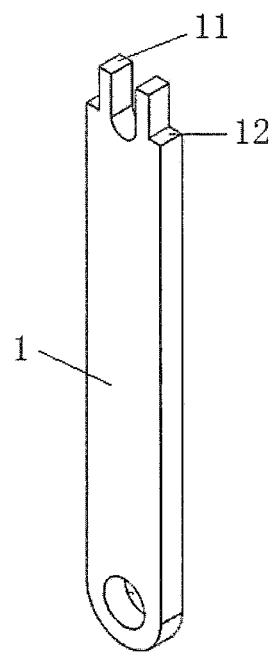
FIG. 3 is a schematic view showing a structure of a first member of the connector disengagement apparatus according to an embodiment of the present invention.

As illustrated in FIG. 3, as an example, the first member 1 is provided with a top face 11 and a stop face 12 at its end towards the stiffener 4. The top face 11 which faces towards the stiffener 4 and extends beyond the stopping face 12, may pass through the clamp plate 10 and contact with the stiffener 4 (for example the edge of the stiffener 4) to lift the stiffener 4 (for example the edge of the stiffener 4) vertically with driven by the second member 2 such that the stiffener 4 generates a upward force to drive the FPC connector to move upwards to finally interrupt the connection. After the connection is interrupted, the first member 1 may continue to move upwards in whole. At that time, as the upper cover 7 of the jig may limit the position of the stopping face 12, i.e., when the first member 1 move upwards to a certain position, the upper cover 7 of the jig may stop the stopping face 12 so as to prevent the top face 11 from continuing to move upwards.

In an example, the first member 1 has two top faces 11, the distance between the two top faces 11 is provided to correspond to the width of the part of the connector (for example the male plug 18) on the stiffener 4. The plane in which the force applied by the top face 11 is located is perpendicular to the stiffener 4 (for example its edge).

Figure 4:
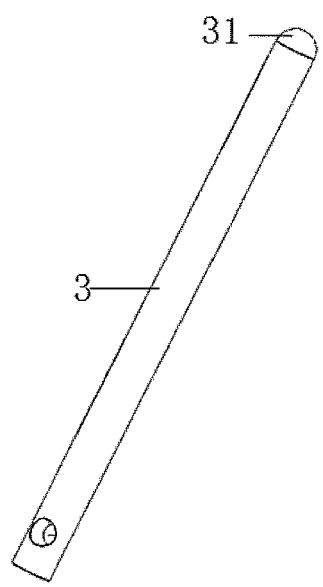
FIG. 4 is a schematic view showing a structure of a third member of the connector disengagement apparatus according to an embodiment of the present invention.
Figure 5:
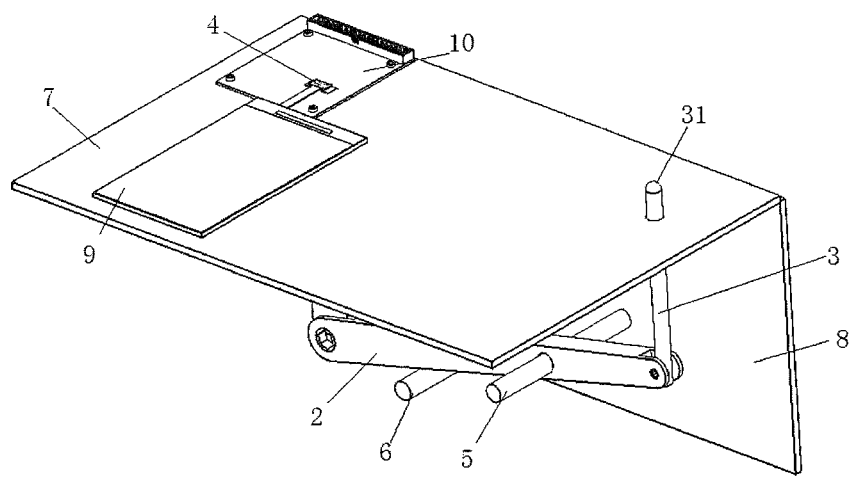
FIG. 5 is a schematic perspective view showing an inspection system for a liquid crystal display module according to an embodiment of the present invention.
Figure 9:
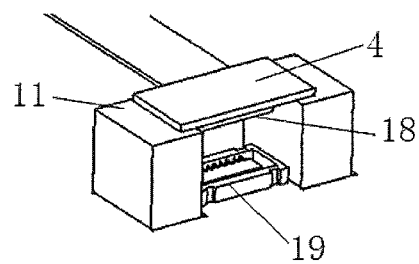
FIG. 9 is a schematic view showing the connector in a disconnected state according to an embodiment of the present invention.

As illustrated in FIGS. 5 and 9, an embodiment of the present invention provides an inspection system for a liquid crystal display module, comprising: a connector disengagement apparatus as described in any one of the above embodiments; and a jig comprising the connector, a side wall 8 and an upper cover 7 connected vertically to the side wall 8. The connector comprises a female plug 19 and a male plug 18. One of the female plug 19 and the male plug 18 (for example the female plug 19) is connected with a printed circuit board, and the other (for example the male plug 18) is connected to the liquid crystal display module 9 to be inspected. The stiffener 4 of the connector disengagement apparatus is connected securely to one of the female plug 19 and the male plug 18 (for example the male plug 18 connected to the liquid crystal display module 9 to be inspected). The upper cover 7 is provided with a clamp for clamping the printed circuit board thereon. As an example, for the sake of convenience in operation to ensure the position accuracy in connection, the rotation axle 5 of the connector disengagement apparatus is arranged to pass through the second member 2 and fixed to the side wall 8 within the jig. And as an example, the third member 3 of the connector disengagement apparatus passes through the upper cover 7 of the jig, and the part of the third member 3 extending beyond the upper cover 7 (for example above the upper cover 7) forms a pressing portion 31 (for example on the top of the third member 3) to be pressed. For example, the pressing portion 31 may be used as a button to be pressed by the operator, as illustrated in FIG. 4, for convenience in operation.

In an example, the body of the disengagement apparatus may be hidden below the upper cover 7 of the jig without interfering with the connection of the connector. In particular, for a B2B (Board to Board) connector, it includes the male plug 18 which is connected to the liquid crystal display module 9 to be inspected via wires and the female plug 19 which is connected to the PCB. When the female plug 19 is engaged with the male plug 18, the inspection for lighting the liquid crystal display module 9 may be performed. As the projection of the female plug 19 in height is not interfered with other members, the connection between the male plug 18 and the female plug 19 will not be interfered with other members, not as the conventional elastic structure does. In this way, the position accuracy can be ensured when the plugs are connected.

Figure 6:
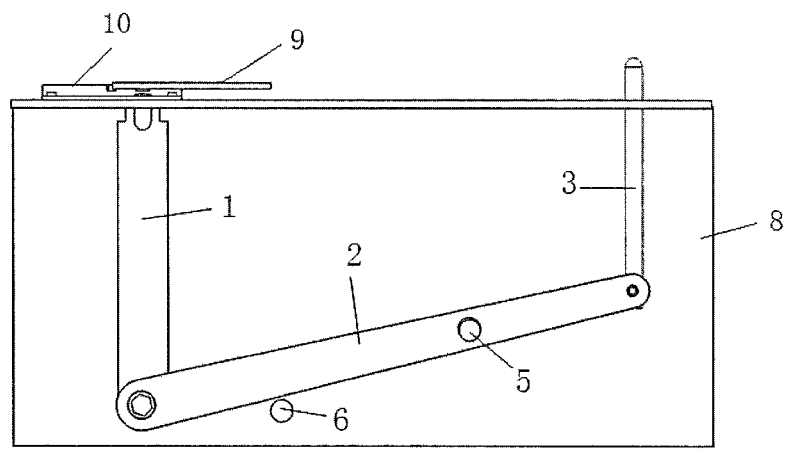
FIG. 6 is a schematic front view showing an inspection system for a liquid crystal display module according to an embodiment of the present invention.
Figure 7:
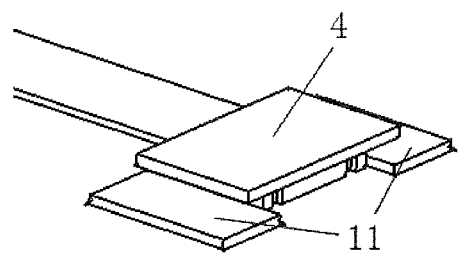
FIG. 7 is a schematic view showing a positional relationship between a top face of the first member and a stiffener according to an embodiment of the present invention.

As an example, the operation process of the connector disengagement apparatus according to an embodiment of the present invention includes the following steps:

The first step: as illustrated in FIG. 6, the connector part of the FPC is connected with the connector part of the PCB clamp, i.e., the male plug 18 is connected to the female plug 19, when the inspection for lighting the liquid crystal display module is performed. Since the sum of weights of the part of the second member 2 at the left side of the rotation axle 5 and the first member 1 is greater than that of the part of the second member 2 at the right side of the rotation axle 5 and the third member 3, such that the second member 2 is inclined to the left and the top face 11 of the first member 1 may also be located at a lower position as illustrated in FIG. 7, thus, the connector disengagement apparatus is in whole in the naturally balanced state.

Figure 8:
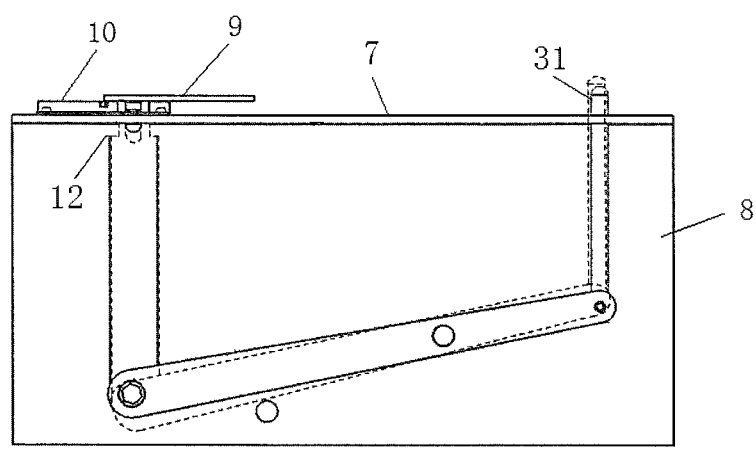
FIG. 8 is a schematic view showing a state of an inspection system for a liquid crystal display module according to an embodiment of the present invention.

The second step: as illustrated in FIG. 8, after the inspection ends, the connection needs to be interrupted. The pressing portion 31 is pressed down to move the third member 3 downwardly while the second member 2 is rotated clockwise about the rotation axle 5. In accordance with the lever principle, as illustrated in FIG. 9, the first member 1 moves upwardly as the second member 2 is rotated clockwise such that the top face 11 of the first member 1 projects beyond the surface of the clamp plate 10 to a relatively high position, so as to ensure the top face 11 of the first member 1 to act on the edge of the stiffener 4. The stiffener 4 moves the connector part of the FPC upwardly after it is applied by the upward force so as to interrupt the connection. After the connection is interrupted, the first member 1 may in whole continue to move upwardly. At that time, due to the stopping effect of the stopping face 12, i.e., the stopping face 12 is stopped by the upper cover 7 of the jig to cause the upward movement of the top face 11 to cease. And as the second member 2 is rotated by a tiny angle, the horizontal displacement produced by the first member 1 driven by the second member 2 may be omitted.

The third step: after the connection between the connector part of the FPC and the connector part of the PCB clamp is interrupted, if the force on the pressing portion 31 is withdrawn, the second member 2 will be rotated anticlockwise about the rotation axle 5 under gravity so as to achieve the restoration of the entire system, because the sum of weights of the part of the second member 2 at the left side of the rotation axle 5 and the first member 1 is greater than that of the part of the second member 2 at the right side of the rotation axle 5 and the third member 3.

In summary, in the connector disengagement apparatus according to the embodiment of the present invention, one end of the first member 1 is connected to one end of the second member 2, while the other end of the first member 1 is arranged towards the stiffener 4 and the other end of the second member 2 is connected to the third member 3. The second member 2 is rotatable about the rotation axle 5. The connector disengagement apparatus may act on the stiffener 4 of the FPC in a down-to-up direction to lift the stiffener 4 to interrupt efficiently the connection between the connector part of the FPC and the connector part of the PCB clamp. In the entire disengagement process, the FPC stiffener is subject to the even force and the plug pins of the connector will not be damaged as the force of the disengagement apparatus is not directly applied onto the connector. In an example, the disengagement apparatus achieves a function of automatic restoration on basis of the mechanical principle of unequal torque lever. In this way, it can operate conveniently without limiting the projecting height of the female plug of the connector and without any interference connection, thus, the positioning accuracy in connection will be ensured. In addition, with the rotation axle 5 passing through the second member 2 and being fixed to the side wall 8 in the jig, the third member 3 passes through the upper cover 7 of the jig and the third member 3 is provided with the pressing portion 31 on the top thereof so as to achieve the disengagement of the connection with the stiffener in the inspection for lighting the liquid crystal display module 9.

Although in the above embodiments, the male plug of the connector is used as the connector part of the FPC while the female plug of the connector is used as the connector part of the PCB clamp, the skilled person in the art should be appreciated that this is not limited, but by way of examples, for example, the male plug of the connector may be used as the connector part of the PCB clamp while the female plug of the connector may be used as the connector part of the FPC.

Although several exemplary embodiments have been shown and described, the present invention is not limited to those and it would be appreciated by those skilled in the art that various changes or modifications may be made in these embodiments without departing from the principles and spirit of the disclosure, which should fall within the scope of the present invention. The scope of the invention is defined in the claims and their equivalents.

What is claimed is:

1. A connector disengagement apparatus, comprising a first member, a second member, a third member, a rotation axle and a stiffener carrying a part of a connector, one end of the first member being connected to one end of the second member, the other end of the first member being arranged towards the stiffener, the other end of the second member being connected to the third member, wherein the second member is rotatable about the rotation axle, wherein the connector comprises a female plug and a male plug, and the stiffener of the connector disengagement apparatus is fixedly connected to one of the female plug and the male plug.

2. The connector disengagement apparatus according to claim 1, wherein the rotation axle is arranged to pass through the second member.

3. The connector disengagement apparatus according to claim 2, wherein, with respect to the rotation axle, the weight sum of the part of the second member at the side thereof connected to the first member and the first member is greater than that of the part of the second member at the side thereof connected to the third member and the third member.

4. The connector disengagement apparatus according to claim 3, wherein a stopper is provided below the second member at the side thereof connected to the first member and configured to limit the rotation of the second member with respect to the rotation axle.

5. The connector disengagement apparatus according to claim 2, wherein the second member is provided on two ends thereof with a first terminal hinged to an end of the first member and a second terminal hinged to an end of the third member respectively, and wherein an axle hole through which the rotation axle passes is arranged between the first terminal and the second terminal on the second member.

6. The connector disengagement apparatus according to claim 5, wherein each of the first terminal and the second terminal has a semicircular shape, the first terminal having a radius 1.5-2.5 times greater than that of the second terminal.

7. The connector disengagement apparatus according to claim 6, wherein the first terminal is provided with a first circular hole at its circular center, the first circular hole being hinged by a pin to the first member, and wherein the second terminal is provided with a second circular hole at its circular center, the second circular hole being hinged by a pin to the third member.

8. The connector disengagement apparatus according to claim 7, wherein a center distance between the first circular hole and the axle hole is 2-4 times greater than that between the second circular hole and the axle hole.

9. The connector disengagement apparatus according to claim 1, wherein the first member is provided with a top face and a stop face at its end towards the stiffener, wherein the top face which faces towards the stiffener and extends beyond the stop face is configured to lift the stiffener, the stop face being configured to limit the movement of the top face.

10. The connector disengagement apparatus according to claim 9, wherein the first member has two top faces, and a distance between the two top faces corresponds to a width of the part of the connector on the stiffener.

11. An inspection system for a liquid crystal display module, comprising:
   a connector disengagement apparatus comprising a first member, a second member, a third member, a rotation axle and a stiffener carrying a part of a connector, one end of the first member being connected to one end of the second member, the other end of the first member being arranged towards the stiffener, the other end of the second member being connected to the third member, wherein the second member is rotatable about the rotation axle; and
   a jig comprising the connector, a side wall and an upper cover vertically connected to the side wall, the connector comprising a female plug and a male plug,
   wherein one of the female plug and the male plug is connected with a printed circuit board, and the other is connected to the liquid crystal display module to be inspected, the stiffener of the connector disengagement apparatus being fixedly connected to one of the female plug and the male plug, and the upper cover being provided with a clamp for clamping the printed circuit board thereon.

12. The inspection system according to claim 11, wherein the rotation axle of the connector disengagement apparatus is arranged to pass through the second member and fixed to the side wall, the third member of the connector disengagement apparatus passing through the upper cover, and wherein the part of the third member extending beyond the upper cover forms a pressing portion to be pressed.

13. The inspection system according to claim 12, wherein, with respect to the rotation axle, the weight sum of the part of the second member at the side thereof connected to the first member and the first member is greater than that of the part of the second member at the side connected to the third member and the third member.

14. The inspection system according to claim 13, wherein a stopper is provided below the second member at the side thereof connected to the first member and configured to limit the rotation of the second member with respect to the rotation axle.

15. The inspection system according to claim 12, wherein the second member is provided on two ends thereof with a first terminal hinged to an end of the first member and a second terminal hinged to an end of the third member respectively, and wherein an axle hole through which the rotation axle passes is arranged between the first terminal and the second terminal on the second member.

16. The inspection system according to claim 15, wherein each of the first terminal and the second terminal has a semicircular shape, the first terminal having a radius 1.5-2.5 times greater than that of the second terminal.

17. The inspection system according to claim 16, wherein the first terminal is provided with a first circular hole at its circular center, the first circular hole being hinged by a pin to the first member, and wherein the second terminal is provided with a second circular hole at its circular center, the second circular hole being hinged by a pin to the third member.

18. The inspection system according to claim 17, wherein a center distance between the first circular hole and the axle hole is 2-4 times greater than that between the second circular hole and the axle hole.

19. The inspection system according to claim 11, wherein the first member is provided with a top face and a stop face at its end towards the stiffener, wherein the top face which faces towards the stiffener and extends beyond the stop face is configured to lift the stiffener, the stop face being configured to limit the movement of the top face.

20. The inspection system according to claim 19, wherein the number of the top faces of the first member is two, and a distance between the two top faces corresponds to a width of the part of the connector on the stiffener.

* * * * *